United States Patent [19]

D'Addieco

[11] 4,271,236

[45] Jun. 2, 1981

[54] AIR FIREABLE END TERMINATION COMPOSITIONS FOR MULTILAYER CAPACITORS BASED ON NICKEL BORIDES

[75] Inventor: Alfred A. D'Addieco, Grand Island, N.Y.

[73] Assignee: E. I. Du Pont de Nemours and Company, Wilmington, Del.

[21] Appl. No.: 88,842

[22] Filed: Oct. 29, 1979

[51] Int. Cl.$^3$ .................. B32B 15/02; H01B 1/02; H01B 1/06
[52] U.S. Cl. .................. 428/426; 252/513; 252/519; 428/411; 428/427; 428/432; 428/433; 428/901; 75/254
[58] Field of Search ............ 428/427, 426, 411, 539, 428/433, 901, 432; 252/519, 513

[56] References Cited

U.S. PATENT DOCUMENTS

| | | | |
|---|---|---|---|
| 3,503,801 | 3/1970 | Huang | 428/427 |
| 3,624,007 | 11/1971 | Meyer | 252/513 |
| 3,929,674 | 12/1975 | Patterson | 428/427 |
| 3,943,168 | 3/1976 | Patterson | 252/518 |
| 4,016,447 | 4/1977 | Patterson | 428/427 |
| 4,064,310 | 12/1977 | Patterson | 428/427 |
| 4,070,517 | 1/1978 | Kazmierowicz | 252/513 |
| 4,101,710 | 7/1978 | Marcus | 252/519 |
| 4,122,232 | 10/1978 | Kuo | 252/513 |
| 4,127,511 | 11/1978 | Klein | 428/426 |

*Primary Examiner*—Ellis P. Robinson

[57] ABSTRACT

Air fireable nickel boride-based end termination compositions for multilayer capacitors are provided. The nickel boride compounds utilized are either $(Ni_3B)_a(Ni_3Si)_b$ or $Ni_3B_{1-x}P_x$ and the compositions also contain a glass whose component oxides have a redox potential of less than $-0.5$ volt. These compositions, upon firing, afford conductors such as end terminations in multilayer capacitors having excellent solderability and solder leach resistance, adhesion to dielectric substrates and electrical properties substantially equivalent to standard silver/palladium conductors.

12 Claims, No Drawings

AIR FIREABLE END TERMINATION COMPOSITIONS FOR MULTILAYER CAPACITORS BASED ON NICKEL BORIDES

DESCRIPTION

1. Technical Field

This invention relates to thick film air fireable conductor compositions and more particularly to such compositions based on $(Ni_3B)_a(Ni_3Si)_b$ or $Ni_3B_{1-x}P_x$ compounds.

2. Background Art

Conductor compositions which are applied to and fired on dielectric substrates (glass, glass-ceramic, and ceramic) usually comprise finely divided inorganic powders (e.g., metal particles and binder particles) and are commonly applied to substrates using so-called "thick film" techniques, as a dispersion of these inorganic powders in an inert liquid medium or vehicle. Upon firing or sintering of the printed film, the metallic component of the composition provides the functional (conductive) utility, while the inorganic binder (e.g., glass, $Bi_2O_3$, etc.) bonds the metal particles to one another and to the substrate. Thick film techniques are contrasted with thin film techniques which involve deposition of particles by evaporation or sputtering. Thick film techniques are generally discussed in "Handbook of Materials and Processes for Electronics," C. A. Harper, Editor, McGraw-Hill, N.Y. 1970, Chapter 12.

The most commonly used conductor compositions employ noble metals, especially gold, silver, platinum, palladium, and their mixtures, alloys, and compounds, since their relatively inert characteristics permit firing in air. Attempts at using dispersions of less expensive non-noble metals have often been confined to specialized uses or have required the great practical inconvenience and expense of firing in non-oxidizing atmospheres (nitrogen, nitrogen/hydrogen, hydrogen, argon, etc.).

There is a distinct commercial need for less expensive conductor compositions which can be fired in air to produce adherent low resistivity conductors on dielectric substrates, including microcircuit patterns, end terminations for capacitors, etc.

U.S. Pat. No. 3,943,168, issued Mar. 6, 1976 to F. K. Patterson, discloses nickel compounds of the overall approximate formula of $(Ni_3B)_a(Ni_3Si)_b$ while U.S. Pat. No. 4,016,447, issued Apr. 5, 1977 to F. K. Patterson, discloses the use of compositions based on these conductive materials adhered to dielectric substrates. The conductor compositions also contain, in addition to the nickel compounds, conventional inorganic binders such as glass. There is, however, an undesirable reaction, during firing, between $Ni_3B$ and the reducible metal oxide components of conventional glasses which leads to loss of adhesion between the conductor and the substrate.

U.S. Pat. No. 4,064,310, issued Dec. 20, 1977, to F. K. Patterson, discloses conductor compositions based on finely divided $Ni_3B_{1-x}P_x$ and the use of such conductor compositions, also containing conventional glasses, adhered to dielectric substrates. Such conductor compositions also suffer from the disadvantages described above.

There is, therefore, a more specific commercial need for economical conductive compositions which can be fired in air and have improved adhesive properties on a variety of substrates.

DISCLOSURE OF THE INVENTION

The air fireable conductive compositions of this invention are thick film compositions and consist essentially of:

(A) 80–95 parts by weight, based on the weight of (A) plus (B), of a conductor compound selected from
 (1) $(Ni_3B)_a(Ni_3Si)_b$ where $a+b=1$, $a=\frac{1}{3}-1$ and, $b=0-\frac{2}{3}$; and,
 (2) $Ni_3B_{1-x}P_x$ where $x=0.05-0.6$
and containing 0–80 parts by weight, based on the weight of (A), of nickel metal;

(B) 20–5 parts by weight, based on the weight of (A) plus (B), of a glass containing at least approximately 90% by weight of the component oxides having reduction potentials less than approximately $-0.5$ volt, the glass having softening point sufficiently high to bind the composition to a dielectric substrate upon firing but below the temperature at which the conductor compound reacts with the dielectric substrate to which it is applied; and (C) organic vehicle wherein the ratio of (A) plus (B) to the vehicle is in the range of 19:1 to 1:9 by weight.

DESCRIPTION OF THE INVENTION

The conductor compounds of this invention comprise one or more compounds of nickel, wherein the compounds of nickel have the overall approximate composition

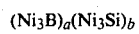

$$(Ni_3B)_a(Ni_3Si)_b$$

wherein the sum of a plus b equals one, a is in the range $\frac{1}{3}$ to 1, and b is in the range 0 to $\frac{2}{3}$, on a molar basis. By this compositional formula it is not implied that only chemical compounds are involved, as discussed more fully below. The compositional formula is meant to indicate an $Ni_3B/Ni_3Si$ ratio where such borides and silicides are present in any of the chemical forms discussed herein. In these compositions the nickel compounds are one or more of $Ni_3B$; solid solutions of the formula

$$Ni_3B_{1-x}Si_x,$$

wherein x is in the approximate range up to 0.1; mixtures of either $Ni_3B$ or $Ni_3B_{1-x}Si_x$ solid solutions with $Ni_3Si$; or mixtures of $Ni_3B$ and $Ni_3Si$. In any such nickel compound or combination of nickel compounds, the total amount of B and Si is such that the atomic ratio B/Si is no less than $\frac{1}{2}$, that is, there are up to but no more than 2 Si atoms per B atom in the nickel compounds. Restated, the amount of Si present in the total of such nickel compounds present is no more than two times the amount of B present, on an atomic basis. Amounts of silicon in excess of that level tend to increase resistivity to unacceptable levels.

The conductor compounds also comprise a nickel compound of the formula $Ni_3B_{1-x}P_x$, wherein x is in the approximate range of 0.05–0.6, preferably 0.1–0.4, and more preferably 0.1–0.2. It is thought that through most of this compositional range, once the appropriate starting materials have been melted together, a single-phase material (perhaps a solid solution) is formed. X-ray data at $x=0.05$ and $x=0.4$ confirm this. It is possible that a second phase may be present at x of about 0.6, but so long as the stated atomic ratios are placed into the batch and melted, the nickel material of this invention is present.

The compositions of this invention may additionally comprise nickel metal powder. The amount of nickel powder is somewhat dependent upon the firing temperature used, but can be up to 80% of the total weight of the nickel and nickel compounds present. At lower firing temperatures the amount of nickel metal powder present can conveniently be at the upper end of this range (near 80% of total nickel compounds).

The conductor compounds are present in the conductive compositions to the extent of 80–95 parts by weight of the solids content of the composition, the rest being glass. The preferred conductor to glass ratio range is from 6.5:1 to approximately 14.4:1.

The preparation of the nickel boride-containing conductors can be carried out as described in U.S. Pat. No. 3,943,168, which is hereby incorporated by reference.

$Ni_3B$ (99% pure) is reduced in size to a powder having a surface area of about 0.7–1.7 $m^2/g$. The powder is washed at room temperature with a $\frac{1}{3}$ (by volume) solution of concentrated aqueous HCl and water.

$Ni_3Si$ is prepared from the elements by arc melting under argon followed by annealing in vacuum at 950° C. It is reduced in size to minus 400 mesh.

Solid solutions of the formula $Ni_3B_{1-x}Si_x$ are prepared by mixing the elements in the desired proportions, then arc melting the mixture under dry argon on a water-cooled copper hearth. A thoriated tungsten electrode is used.

In addition to such solid solutions, wherein x does not exceed 0.10, also prepared by the same arc melting technique are mixtures of $Ni_3Si$ and $Ni_3B_{1-x}Si_x$ (it was observed that such mixtures are miscible in the liquid state). After solidification the mixtures are pulverized and screen to minus 400 mesh.

The preparation of the nickel boride phosphide conductors can be carried out as described in U.S. Pat. No. 4,064,310, which is also hereby incorporated by reference.

These nickel materials can be made by heating appropriate relative quantities of starting materials (e.g., Ni, B, $Ni_2P$, $Ni_3B$, etc.) in an inert atmosphere (e.g., argon) to form a liquid, cooling and comminuting the resultant ingot sufficiently finely to pass through a 400-mesh screen. Dependent upon desired fired properties or firing conditions, further comminution may be desirable.

These materials are prepared by melting starting powder materials at 1200°–1400° C. in a high-purity alumina crucible in an atmosphere of purified argon. Heating is generally 100°–300° C. above the temperature at which the charge is entirely molten. Once the charge is molten, it is held at that temperature for about 10 minutes. Heating is by an induction furnace. The starting materials are varied but comprise the desired atomic ratios of Ni, B, and P. In some preparations the starting materials are Ni, B, and $Ni_2P$; in others, Ni, $Ni_3B$, and $Ni_2P$ are used. After the melting step, the charge is allowed to cool to an ingot, which is then comminuted to a particle size such that the resultant powder passes through at least a 400-mesh screen.

The problems attendant to the firing in air of non-noble metal conductor compositions, and specifically those based on the nickel compounds utilized in this invention, were discovered and can be best understood by examining the several reactions which can occur during firing of such nickel-based conductors on a substrate such as a $BaTiO_3$ dielectric:

1. Reactions with air:
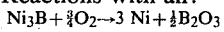

$Ni + \frac{1}{2}O_2 \rightarrow NiO$

2. Reactions with reducible metal oxides (MO) and glasses containing these:
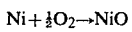

3. Reaction with $BaTiO_3$:
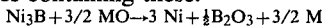

All of the above reactions are temperature dependent and for that reason it is desirable to use low firing glass. The oxidation of Ni to NiO tends to make the fired conductor, such as the end termination in a multilayer capacitor (MLC), difficult to solder using conventional mildly activated fluxes. The generation of $B_2O_3$ in the first of two reactions in reaction (1) is desirable to some extent since $B_2O_3$ can encapsulate the nickel metal to protect it from further oxidation.

Since $Ni_3B$ is a powerful reducing agent, it was discovered that reaction (2) shown above destroys the metal oxides, present in the commonly employed glass frits or separately added, such as $Bi_2O_3$, PbO, to some extent thereby altering bonding parameters. This, in turn, adversely affects the desirable termination-to-dielectric adhesion.

$Ni_3B$ can also reduce the $BaTiO_3$, present in the capacitor body, to a lower oxidation state, $BaTiO_{<3}$. Such materials are not good as dielectric materials, they become semiconductors.

Having discovered the problems and their causes during firing in air, it was found that utilizing glasses containing at least approximately 90% by weight of the component oxides having reduction potentials less than approximately −0.5 volt and having softening points sufficiently high to bind the composition to a dielectric substrate upon firing but below the temperature at which the conductor compound reacts with the dielectric substrate to which it is applied, substantially eliminates these problems. In general, the glass will have a softening point below approximately 600° C. and will not exceed 625° C. when utilized with $BaTiO_3$ dielectrics.

A perusal of the "Handbook of Chemistry and Physics", 48th edition, 1967–68, Chemical Rubber Publishing Company, see tabulation below, and experimental observations, such as reduction of CdO by $Ni_3B$ but nonreduction of ZnO, lead to the critical value for the reduction potential, $E°_{red}$, of less than approximately −0.5 volt.

| Reaction | $E°_{red}$(volt) |
| --- | --- |
| $Pb^{+2} + 2e \rightarrow Pb$ | −0.1263 |
| $Ni^{+2} + 2e \rightarrow Ni$ | −0.23 |
| $Cd^{+2} + 2e \rightarrow Cd$ | −0.4026 |
| $Ni_3B + 3/2 \, O \rightarrow 3 \, Ni + \frac{1}{2} B_2O_3$ | −0.5 (estimated) |
| $Zn^{++} + 2e \rightarrow Zn$ | −0.7628 |
| $Al^{+++} + 3e \rightarrow Al$ | −1.706 |
| $Mg^{++} + 2e \rightarrow Mg$ | −2.375 |
| $Ca^{++} + 2e \rightarrow Ca$ | −2.76 |
| $Sr^{++} + 2e \rightarrow Sr$ | −2.89 |
| $Ba^{++} + 2e \rightarrow Ba$ | −2.90 |
| $Na^+ + e \rightarrow Na$ | −2.7109 |
| $Cs^+ + e \rightarrow Cs$ | −2.923 |
| $K^+ + e \rightarrow K$ | −2.924 |
| $Rb^+ + e \rightarrow Rb$ | −2.925 |

-continued

| Reaction | $E°_{red}$(volt) |
| --- | --- |
| $Li^+ + e \rightarrow Li$ | −3.045 |

The oxides of elements appearing in the tabulation above the Ni₃B/oxygen reaction are expected to be reduced by Ni₃B during firing to the detriment of adhesive properties while those below are not. These latter oxides and oxide components of glasses are contemplated within this invention, provided they meet the softening point requirements imposed by the desirability of low firing temperatures. Also, the glasses should not devitrify during firing.

The glasses are present to the extent of 5–20 parts by weight of the solids content of the conductive composition of this invention.

Among the glasses fitting the requirements of this invention are the following:

TABLE 1

| Component Oxide | Glass (components by weight %) | | | | | |
| --- | --- | --- | --- | --- | --- | --- |
| | A | B | C | D | E | F |
| Li₂O | 10.5 | 10.0 | 7.9 | 8.0 | 9.9 | 10.0 |
| BaO | 15.0 | 20.0 | 19.9 | 19.8 | 16.0 | 20.0 |
| B₂O₃ | 70.0 | 66.0 | 65.1 | 65.4 | 65.3 | 66.0 |
| Al₂O₃ | 4.5 | 4.0 | 3.9 | 4.0 | 4.0 | |
| K₂O | | | 3.2 | | | |
| Na₂O | | | | 2.8 | | |
| TiO₂ | | | | | 4.8 | |
| SiO₂ | | | | | | 4.0 |

| Component Oxide | Glass (components by weight %) | | | | |
| --- | --- | --- | --- | --- | --- |
| | G | H | I | J | K |
| Li₂O | | | | | 4.5 |
| BaO | 16.5 | 16.6 | 18.1 | 17.7 | 20.0 |
| B₂O₃ | 54.3 | 55.2 | 59.6 | 58.5 | 66.0 |
| Al₂O₃ | 3.3 | | 3.6 | 3.6 | 4.0 |
| K₂O | 25.9 | 26.3 | | 5.5 | |
| Na₂O | | | 18.7 | 14.7 | 5.5 |
| TiO₂ | | | | | |
| SiO₂ | | 1.9 | | | |

Glasses B, G, H, I, J, and K are preferred and represent the best mode of carrying out the invention when combined with Ni₃B as the conductor compound in a ratio of 7.2:1 (Ni₃B:glass B) or in a ratio of 14.4:1 (Ni₃B:glasses G, H, I, J or K).

The glasses are prepared by conventional glass-making techniques, by mixing the desired components (or precursors thereof, e.g., H₃BO₃ for B₂O₃) in the desired proportions and heating the mixture to form a melt. As is well known in the art, heating is conducted to a peak temperature and for a time such that the melt becomes entirely liquid, yet gaseous evolution has ceased. In the present work the components are premixed by rolling in a jar and then melted in a Pt crucible at 1000° C. The melt is then poured into cold water and, after separation from the quench water, the crude frit is freed from residual water by drying in an oven or by displacing the water by rinsing with methanol. The crude frit is then ball-milled for 40 hours in Freon TF ® solvent (a registered trademark of E. I. du Pont de Nemours and Co.) using alumina balls. After discharging the milled frit slurry from the mill, the excess solvent is removed by decantation and the frit powder is air dried at room temperature. The dried powder is then screened through a 60-mesh screen to remove any large particles.

The inorganic solids content of the conductive compositions of this invention are dispersed in an organic vehicle to form printable composition pastes. The ratio of the inorganics to the vehicle is in the range of from 19:1 to 1:9 by weight.

Any inert liquid can be used as the vehicle. Water or any one of various organic liquids, with or without thickening and/or stabilizing agents and/or other common additives, can be used as the vehicle. Exemplary of the organic liquids which can be used are the aliphatic alcohols; esters of such alcohols, for example, the acetates and propionates; terpenes such as pine oil, terpineol and the like; solutions of resins such as the polymethacrylates of lower alcohols, or solutions of ethyl cellulose, in solvents such as pine oil and the monobutyl ether of ethylene glycol monoacetate. The vehicle can contain or be composed of volatile liquids to promote fast setting after application to the substrate.

A preferred vehicle is based on ethyl cellulose and beta-terpineol. The pastes are conveniently prepared on a three-roll mill. A preferred viscosity of these compositions is approximately 25 Pa.S, measured on a Brookfield LVT viscometer using #4 spindle at 12 rpm.

The conductive compositions can be printed as film onto ceramic, alumina or other dielectric substrates in the conventional manner. Often, a BaTiO₃ substrate is utilized. Generally, screen stenciling techniques are preferably employed. The resulting printed patterns are allowed to level out, dried at elevated temperatures such as at 80° C. for approximately 10 minutes, and fired in air in a belt furnace at a peak temperature not exceeding approximately 650° C.

Testing for soldered adhesion performance is conducted on disc capacitor bodies (American Lava, K8000, 14-mm diameter, 21 mils thick) since testing for soldered adhesion on MLC parts is tedious and time-consuming. The conductive nickel termination compositions are screen-printed on both sides of the discs using a 200-mesh S.S. screen with an 11-mm diameter circular pattern and the printed discs are dried in an oven at 80° C. The discs are then fired in a belt furnace under various time/temperature conditions by varying the belt speed and peak firing temperature settings. The belt furnace used has five heating zones distributed over a 90-inch heating path with 20 inches of the path at peak temperature. Pretinned leads were attached to the terminations by solder-dipping using a 62 Sn/36 Pb/2 Ag or 60 Sn/40 Pb solder. A special flux is required consisting of a solution of 20% tartaric acid by weight in ethylene glycol. Effective fluxing times vary from 30–120 seconds at room temperature to 10 seconds or less at 75° C. or above. Adhesion measurements are made by pulling the leads in a Chatillon tester (Model LTCM Series 160). Pull values of 4.5 lb (2.05 kg) are considered acceptable based on pull tests on a number of series of control tests run with discs terminated with standard Pd/Ag products.

The conductive compositions of this invention are also tested for their electrical properties. Nickel compound-based termination compositions are applied to various types of commercial MLC bodies by hand-dipping. After drying, the terminations are fired under conditions optimized for soldered adhesion as predetermined by screening tests with discs. Capacitance and dissipation factors (DF) are measured in both soldered and unsoldered parts versus time of storage both under ambient conditions and under 88–90% RH at 44°–45° C. Terminated parts with soldered leads attached can also be load life tested under 100 volts DC/mil at 85° C. Parts terminated with a standard Pd/Ag product are used as controls.

Testing for the softening point of glasses is done utilizing ASTM C338-57, "Standard Method of Test for Softening Point of Glass".

In the Examples below, illustrating the invention, all parts are by weight unless otherwise indicated.

EXAMPLES 1–12

A. Preparation of Glass

The preparation of glasses A-K is carried out as described in the specification utilizing the compounds and their amounts shown in Table 2 resulting in the compositions shown in Table 1.

TABLE 2
Batch Compositions for Glasses A–K

| Component | Glass (components by weight %) | | | | | |
|---|---|---|---|---|---|---|
| | A | B | C | D | E | F |
| $Li_2CO_3$ | 14.7 | 14.2 | 11.4 | 11.4 | 14.2 | 14.4 |
| $BaCO_3$ | 10.9 | 14.8 | 14.8 | 14.8 | 12.0 | 15.0 |
| $H_3BO_3$ | 70.5 | 67.5 | 67.5 | 67.5 | 67.5 | 68.3 |
| $Al_2O_3 \cdot 3H_2O$ | 3.9 | 3.5 | 3.5 | 3.5 | | |
| $K_2CO_3$ | | | 2.8 | | | |
| $Na_2CO_3$ | | | | 2.8 | | |
| $TiO_2$ | | | | | 2.8 | |
| $SiO_2$ | | | | | | 2.3 |
| $NaHCO_3$ | | | | | | |

| Component | Glass (components by weight %) | | | | |
|---|---|---|---|---|---|
| | G | H | I | J | K |
| $Li_2CO_3$ | | | | | 6.3 |
| $BaCO_3$ | 13.2 | 13.4 | 12.5 | 12.7 | 14.7 |
| $H_3BO_3$ | 60.1 | 61.3 | 57.2 | 57.7 | 67.0 |
| $Al_2O_3 \cdot 3H_2O$ | 3.1 | | 3.0 | 3.1 | 3.5 |
| $K_2CO_3$ | 23.6 | 24.1 | | 4.5 | |
| $Na_2CO_3$ | | | | | |
| $TiO_2$ | | | | | |
| $SiO_2$ | | 1.2 | | | |
| $NaHCO_3$ | | | 27.3 | 22.0 | 8.5 |

Table 3 summarizes the information on the physical properties of the glasses.

TABLE 3

| | Softening Point (°C.)[1] | Surface Area (m²/g) |
|---|---|---|
| A | 576 | 10.6 |
| B | 562 | 2.2 |
| C | 562 | 5.8 |
| D | 554 | 6.0 |
| E | 567 | 3.3 |
| F | 577 | 1.6 |
| G | 555 | 2.2 |
| H | 563 | 2.7 |
| I | 551 | 2.4 |
| J | 542 | 2.2 |
| K | 561 | 1.2 |

[1]Determined by the fiber stretch method, ASTM C338-57

B. Preparation of Conductive Compositions

The conductive compositions are prepared by roll milling $Ni_3B$ powder, having a surface area range of 0.7–1.2 m²/g, the appropriate glass, nickel metal when desired, and an ethyl cellulose-β-terpineol vehicle. The respective components and their amounts are given in Table 4. Sufficient vehicle is added to achieve an approximate viscosity of 25 Pa.S (Brookfield LVT Viscometer, spindle #4 at 12 rpm). The ethyl cellulose has 47.5–49.0% by weight alkoxyl content and a solution viscosity of 18–24 centipoises as determined as a 5% solution in 80/20 by weight mixture of toluene/ethanol after drying at 100° C. for 30 minutes.

During the preparation of the compositions approximately 90% of the needed vehicle is added prior to adjusting the viscosity to the desired final value. If the composition is below the specified viscosity, more vehicle is added while, if the composition needs to be thinned, β-terpineol is added.

Table 4 also includes relevant viscosity information on the compositions.

TABLE 4
Composition and Properties of Conductive Compositions

| Composition (parts by weight) | 1 | 2 | 3 | 4 |
|---|---|---|---|---|
| $Ni_3B$ | 65 | 65 | 65 | 65 |
| Ni | — | — | — | — |
| Glass (amount) | A(9) | B(9) | C(9) | D(9) |
| Viscosity (Pa . S) | 23 | 24 | 25 | 25 |

| Composition (parts by weight) | 5 | 6 | 7 | 8 |
|---|---|---|---|---|
| $Ni_3B$ | 65 | 65 | 65 | 49 |
| Ni | — | — | — | 16 |
| Glass (amount) | E(9) | F(9) | G(4.5) | G(4.5) |
| Viscosity (Pa . S) | 25 | 25 | 25 | 25 |

| Composition (parts by weight) | 9 | 10 | 11 | 12 |
|---|---|---|---|---|
| $Ni_3B$ | 65 | 65 | 65 | 65 |
| Ni | — | — | — | — |
| Glass (amount) | H(4.5) | I(4.5) | J(4.5) | K(4.5) |
| Viscosity (Pa . S) | 25 | 32 | 32 | 32 |

C. Preparation and Testing of Terminations

The compositions prepared in (B) above are screen printed on various dielectric substrates, dried, and fired to produce the terminations. The firing conditions, along with some of the results of property testing of the terminations, are shown in Table 5. Testing is carried out for soldered lead adhesion, solder leach resistance, and for basic electrical performance properties such as capacitance, dissipation factor, and insulation resistance. Testing for soldered lead adhesion is done on $BaTiO_3$ disc capacitor bodies (available from American Lava, K-8000, 14-mm diameter and 21-mil thick) while electrical properties are tested on commercially available MLC chips terminated by the standard method of hand-dipping the chips in the conductive compositions.

TABLE 5
Preparation and Properties of Terminations

| | Example | | |
|---|---|---|---|
| | 1 | 2 | 3 |
| Firing | | | |
| belt speed (inch/min) | 1.5 | 2 | 2 |
| peak temperature (°C.) | 600 | 575 | 575 |
| Soldered lead adhesion (lb)[8] | ≧4.5 | ≧4.5 | ≧4.5 |
| Capacitance (nF)/DF(%)[2] | | | |
| 0.01% Bi-containing dielectric[3] | 48/1.5 | 48/1.4 | |
| 0.1% Bi-containing dielectric[4] | 2.2/1.3 | | |
| 1.2% Bi-containing dielectric[5] | 8.0/2.4 | | |
| 8% Bi-containing dielectric[6] | 102/2.0 | 105/2.0 | |
| Capacitance (nF)/DF(%)[7] | | | |
| 0.01% Bi-containing dielectric[3] | | 47/1.3 | 47/1.3 |
| 0.1% Bi-containing dielectric[4] | | 2.2/0.02 | 2.2/0.02 |
| 1.2% Bi-containing dielectric[5] | | 11/1.7 | 10/1.7 |
| 8% Bi-containing | | | |

TABLE 5-continued
Preparation and Properties of Terminations

| dielectric[6] | | 105/2.0 | 105/1.9 |
|---|---|---|---|

| | Example | | |
|---|---|---|---|
| | 4 | 5 | 6 |
| Firing | | | |
| belt speed (inch/min) | 2 | 2 | 2 |
| peak temperature (°C.) | 575 | 575 | 575 |
| Soldered lead adhesion(lb)[8] | ≧4.5 | ≧4.5 | ≧4.5 |
| Capacitance (nF)/DF(%)[2] | | | |
| 0.01% Bi-containing dielectric[3] | | | 46/1.4 |
| 0.1% Bi-containing dielectric[4] | | | |
| 1.2% Bi-containing dielectric[5] | | | |
| 8% Bi-containing dielectric[6] | | | 103/2.0 |
| Capacitance (nF)/DF(%)[7] | | | |
| 0.01% Bi-containing dielectric[3] | 45/1.3 | 47/1.3 | 45/1.5 |
| 0.1% Bi-containing dielectric[4] | 2.1/0.02 | 2.2/0.03 | 2.1/0.01 |
| 1.2% Bi-containing dielectric[5] | 10/1.6 | 10/1.6 | 10/1.7 |
| 8% Bi-containing dielectric[6] | 104/1.9 | 102/1.9 | 103/1.9 |

| | Example | | |
|---|---|---|---|
| | 7 | 8 | 9 |
| Firing | | | |
| belt speed (inch/min) | 3 | 3 | 3 |
| peak temperature (°C.) | 550 | 550 | 550 |
| Soldered lead adhesion(lb) | ≧4.5 | ≧4.5 | ≧4.5 |
| Capacitance (nF)/DF(%)[2] | | | |
| 0.01% Bi-containing dielectric[3] | 45/1.4 | | |
| 0.1% Bi-containing dielectric[4] | | | |
| 1.2% Bi-containing dielectric[5] | | | |
| 8% Bi-containing dielectric[6] | | 104/2.0 | |
| Capacitance (nF)/(%)[7] | | | |
| 0.01% Bi-containing dielectric[3] | | 48/1.4 | 45/1.4 |
| 0.1% Bi-containing dielectric[4] | | 2.2/0 | 2.1/0.01 |
| 1.2% Bi-containing dielectric[5] | | 10/1.6 | 10/1.7 |
| 8% Bi-containing dielectric[6] | | 103/2.0 | 103/2.0 |

| | Example | | |
|---|---|---|---|
| | 10 | 11 | 12 |
| Firing | | | |
| belt speed (inch/min) | 3 | 3 | 3 |
| peak temperature (°C.) | 550 | 550 | 575 |
| Soldered lead adhesion(lb)[8] | ≧4.5 | ≧4.5 | ≧4.5 |
| Capacitance (nF)/DF(%)[2] | | | |
| 0.01% Bi-containing dielectric[3] | | | |
| 0.1% Bi-containing dielectric[4] | | | |
| 1.2% Bi-containing dielectric[5] | | | |
| 8% Bi-containing dielectric[6] | | | |
| Capacitance (nF)/(%)[7] | | | |
| 0.01% Bi-containing dielectric[3] | 46/1.4 | 47/1.5 | 47/1.4 |
| 0.1% Bi-containing dielectric[4] | 2.2/0 | 2.2/0.06 | 2.1/0.02 |
| 1.2% Bi-containing dielectric[5] | 10/1.7 | 10/1.7 | 10/1.8 |
| 8% Bi-containing dielectric[6] | 102/2.0 | 103/2.0 | 104/2.0 |

TABLE 5-continued
Preparation and Properties of Terminations

| | Example Control[1] |
|---|---|
| Firing | |
| belt speed (inch/min) | 2 |
| peak temperature (°C.) | 850 |
| Soldered lead adhesion(lb) | ≧4.5 |
| Capacitance (nF)/DF(%)[2] | |
| 0.01% Bi-containing dielectric[3] | 48/1.4 |
| 0.1% Bi-containing dielectric[4] | 2.2/0 |
| 1.2% Bi-containing dielectric[5] | 7.7/2.4 |
| 8% Bi-containing dielectric[6] | 105/2.0 |
| Capacitance (nF)/(%)[7] | |
| 0.01% Bi-containing dielectric[3] | 49/1.5 |
| 0.1% Bi-containing dielectric[4] | 2.2/0 |
| 1.2% Bi-containing dielectric[5] | 10/1.8 |
| 8% Bi-containing dielectric[6] | 107/2.1 |

[1] A standard Pd/Ag (1:4 by weight) termination, Product 4024, available from E. I. du Pont de Nemours and Co.
[2] Measured on fired terminations on commercial MLC bodies.
[3] MLC, available from U.S. Capacitor, a division of Globe Union, as USCC DJ.
[4] MLC, available from Vitramon, Inc., as Vitramon 1808.
[5] MLC, available from Sprague Electric, as C-89.
[6] MLC, available from Vitramon, Inc., as Vitramon 1210.
[7] Measured on terminated, soldered MLC's.
[8] Measured on American Lava, K-8000, 14-mm diameter and 21-mm thick disc capacitors. Values range up to 10 lb. Minimum acceptable value of 4.5 lb. is based on values obtainable with standard Pd/Ag terminations.

Table 6 shows capacitance and dissipation factor values comparing a composition of this invention (Glass A, Example 1) to a conductive composition containing Ni$_3$B but a glass of high softening point (612° C.), placing the composition outside this invention and to a standard Pd/Ag conductor. The conductive composition of this invention is equal to the standard and is superior to the high-softening point glass containing termination. The terminations are fired on the above described USCC DJ MLC chips.

TABLE 6

| Composition | Firing Temperature (°C.) | Capacitance (nF) | Dissipation Factor (%) |
|---|---|---|---|
| Example 1 | 600 | 48 | 1.5 |
| Ni$_3$B/glass[1] | 700 | 41 | 11.9 |
| Pd/Ag standard[2] | 850 | 48 | 1.4 |

[1] Glass having component oxides: ZnO/B$_2$O$_3$/SiO$_2$ and a softening point of 612° C. necessitating a peak firing temperature of 700° C.
[2] Du Pont product 4024.

Soldered lead adhesion data also indicate the superiority of the compositions of this invention. The Ni$_3$B-based compositions shown in Table 6 are fired at various conditions. The Example 1 composition affords ≧4.5-lb. pull values, for leads soldered on the fired terminations, after 600° C. peak firing (furnace belt speed: 1.5 inches/min.) while the composition containing the high softening point glass affords no consistent and acceptable soldered adhesion performance on terminations fired at temperatures up to 675° C. Acceptable solder adhesion performance could be achieved at 700° C. firing; however, this temperature resulted in severe degradation in the dissipation factor (DF) of the capacitor (see Table 6).

The conductor compositions of this invention also afford fired terminations having electrical properties such as storage stability at room temperature or at 88–90% relative stability and 44°–45° C. comparable to standard Pd/Ag-based terminations.

Measurements made on terminations based on the compositions of Examples 2, 6 and 7 and on standard Pd/Ag terminations are summarized below in Table 7; commercial MLC's, USSC DJ, are utilized are substrates:

TABLE 7

Storage Stability of Fired Terminations (Storage at 88–90% RH, 44–45° C.)

| Composition | Length of Storage | |
|---|---|---|
| | 0 hr. | 955 hr. |
| | Cap. (nF)/DF(%) | Cap. (nF)/DF(%) |
| Example 2 | 48/1.4 | 44/2.2 |
| Example 6 | 46/1.4 | 46/1.4 |
| Example 7 | 45/1.4 | 45/1.2 |
| Pd/Ag control (Du Pont 4024) | 48/1.5 | 47/1.3 |

Table 8 summarizes the electrical properties of soldered terminations of this invention, and of a Pd/Ag standard, in a load-life test. Test conditions are 100 volts (DC)/mil and 85° C., terminations fired on USCC LLW 1907-3 capacitors (available from U.S. Capacitor, a division of Globe Union). Insulation resistance (IR) is measured by a Megatrometer (General Radio), dissipation factor, as in all previous tables, by a capacitance bridge. The values given in the table are averages of measurements on 8–9 parts.

TABLE 8

Load-Life Test of Fired and Soldered Terminations

| Composition | Load Time | |
|---|---|---|
| | 0 hr. Cap./DF/IR (nF)/(%)/ (MΩ × 10$^{-3}$) | 1000 hr. Cap./DF/IR (nF)/(%)/ MΩ × 10$^{-3}$ |
| Example 2 | 509/1.6/11 | 463/1.2/14 |
| Example 6 | 512/1.5/13 | 466/1.2/13 |
| Example 7 | 506/1.5/14 | 466/1.3/30 |
| Pd/Ag control (Du Pont 4024) | 520/1.6/15 | 478/1.3/23 |

The above data indicate that the air fireable compositions of this invention are comparable to the standard Pd/Ag-based terminations under load conditions.

Table 9 summarizes solder leach resistance data obtained on terminations based on a composition of this invention in comparison to standard Pd/Ag-based terminations. The nickel-based compositions of this invention afford superior terminations in this respect and in respect of lead adhesion. A 60Sn/40Pb solder is utilized at 260° C. Terminations are printed on high K dielectric discs available from American Lava.

TABLE 9

Solder Leach Resistance and Lead Adhesion

| Conductor Composition | Solder Appearance | Lead Adhesion (pull, lb.) |
|---|---|---|
| Example 2[1] | | |
| first 10-sec. dip | good | 5 |
| second 10-sec. dip | good | 6 |
| third 10-sec. dip | good | 6 |
| Pd/Ag (Du Pont 4024)[2] | | |
| first 10-sec. dip | good | 5 |
| second 10-sec. dip | fair | 4 |
| third 10-sec. dip | very poor | 0 |

[1] Peak firing temperature: 575° C., furnace belt speed: 2 inch/min.; fluxed with 20% by weight tartaric acid in ethylene glycol.
[2] Peak firing temperature: 850° C., furnace belt speed: 2 inch/min.; fluxed with Alpha 611 flux.

I claim:

1. A thick film air fireable conductive composition consisting essentially of:
    (A) 80–95 parts by weight, based on the weight of (A) plus (B), of a conductor compound selected from the group consisting of
        (1) $(Ni_3B)_a(Ni_3Si)_b$ where $a+b=1$, $a=\frac{1}{3}-1$ and, $b=0-\frac{2}{3}$; and,
        (2) $Ni_3B_{1-x}P_x$ where $x=0.05-0.6$;
    (B) 20–5 parts by weight, based on the weight of (A) plus (B), of a glass containing at leasst approximately 90% by weight of the component oxides having reduction potentials less than approximately −0.5 volt, the glass having softening point sufficiently high to bind the composition to a dielectric substrate upon firing but below the temperature at which the conductor compound reacts with the dielectric substrate to which it is applied;
    (C) 0–80 parts by weight, based on the weight of (A), of nickel metal; and
    (D) organic vehicle wherein the ratio of (A) plus (B) to the vehicle is in the range of 19:1 to 1:9 by weight.

2. The composition of claim 1 wherein the conductor compound is $Ni_3B$.

3. The composition of claim 1 wherein the softening point of the glass is below approximately 600° C.

4. The composition of claim 1 wherein the ratio of component (A) to component (B) is from 6.5:1 to 14.4:1.

5. The composition of claim 1 wherein the component oxides of the glass are selected from the group consisting of $Li_2O$, $Na_2O$, $K_2O$, $BaO$, $CaO$, $SiO_2$, $TiO_2$, $B_2O_3$, and $Al_2O_3$.

6. The composition of claim 1 wherein component (A) contains approximately 25 parts by weight, based on the weight of (A), of nickel metal.

7. A thick film air fireable conductive composition consisting essentially of:
    (A) 80–95 parts by weight, based on the weight of (A) plus (B), of a conductor compound having the formula:
        $(Ni_3B)_a(Ni_3Si)_b$ where $a+b=1$, $a=\frac{1}{3}-1$ and, $b=0-\frac{2}{3}$; and,
    containing 0–80 parts by weight, based on the weight of (A), of nickel metal;
    (B) 20–5 parts by weight, based on the weight of (A) plus (B), of a glass containing at least approximately 90% by weight of the component oxides having reduction potentials less than approximately −0.5 volt, the glass having softening point sufficiently high to bind the composition to a dielectric substrate upon firing but below the temperature at which the conductor compound reacts with the dielectric substrate to which it is applied; and
    (C) an organic vehicle wherein the ratio of (A) plus (B) to the vehicle is in the range of 19:1 to 1:9 by weight.

8. The composition of claim 7 wherein the softening point of the glass is below approximately 600° C.

9. The composition of claim 8 wherein the ratio of component (A) to component (B) is from 6.5:1 to 14.4:1.

10. A thick film air fireable conductive composition consisting essentially of:
(A) 80–95 parts by weight, based on the weight of (A) plus (B), of $Ni_3B$; and containing 0–80 parts by weight, based on the weight of (A) of nickel metal;
(B) 20–5 parts by weight, based on the weight of (A) plus (B), of a glass containing at least approximately 90% by weight of the component oxides having reduction potentials less than approximately −0.5 volt, the glass having softening point below approximately 600° C.; and
(C) an organic vehicle wherein the ratio of (A) plus (B) to the vehicle is in the range of 19:1 to 1:9 by weight.

11. A dielectric substrate having the conductive composition of claim 1 fired thereon.

12. A multilayer capacitor having a termination based on the conductive composition of claim 1 fired thereon.

* * * * *